United States Patent
Jebory et al.

(10) Patent No.: US 9,147,609 B2
(45) Date of Patent: Sep. 29, 2015

(54) THROUGH SILICON VIA STRUCTURE, METHOD OF FORMATION, AND INTEGRATION IN SEMICONDUCTOR SUBSTRATE

(75) Inventors: Hadi Jebory, Irvine, CA (US); David J. Howard, Irvine, CA (US)

(73) Assignee: Newport Fab, LLC, Newport Beach, CA (US)

(*) Notice: Subject to any disclaimer, the term of this patent is extended or adjusted under 35 U.S.C. 154(b) by 173 days.

(21) Appl. No.: 13/415,744

(22) Filed: Mar. 8, 2012

(65) Prior Publication Data

US 2013/0087893 A1 Apr. 11, 2013

Related U.S. Application Data

(60) Provisional application No. 61/545,003, filed on Oct. 7, 2011.

(51) Int. Cl.
*H01L 29/40* (2006.01)
*H01L 21/768* (2006.01)
*H01L 23/48* (2006.01)

(52) U.S. Cl.
CPC ........ *H01L 21/76898* (2013.01); *H01L 23/481* (2013.01); *H01L 2924/0002* (2013.01)

(58) Field of Classification Search
CPC ................ H01L 2924/00; H01L 2224/73204; H01L 2924/014; H01L 2224/16225; H01L 2924/0002; H01L 2224/32225; H01L 2924/1461; H01L 2224/48091; H01L 2924/00012; H01L 2224/245; H01L 2924/00015
See application file for complete search history.

(56) References Cited

U.S. PATENT DOCUMENTS

| | | | | |
|---|---|---|---|---|
| 7,795,134 | B2 * | 9/2010 | Sulfridge | 438/637 |
| 2005/0121768 | A1 * | 6/2005 | Edelstein et al. | 257/698 |
| 2008/0258307 | A1 * | 10/2008 | Ito | 257/771 |
| 2011/0237073 | A1 * | 9/2011 | Dao et al. | 438/654 |
| 2012/0139127 | A1 * | 6/2012 | Beyne | 257/774 |

OTHER PUBLICATIONS

Beyne, U.S. Appl. No. 61/420,653.*

* cited by examiner

*Primary Examiner* — Robert Bachner
(74) *Attorney, Agent, or Firm* — Farjami & Farjami LLP

(57) ABSTRACT

Various implementations of through silicon vias with pinched off regions are disclosed. A semiconductor substrate includes a plurality of the through silicon vias disposed in the substrate and extending from a top surface of the substrate to a bottom surface of the substrate. A conductive filler is disposed within each of the plurality of through silicon vias, each of the plurality of through silicon vias having a hollow center which reduces thermal stress in the semiconductor substrate. The plurality of through silicon vias also have pinched off regions at the bottom and/or the top portions of the through silicon vias, which prevent contamination during processing of the semiconductor substrate.

18 Claims, 4 Drawing Sheets

US 9,147,609 B2

THROUGH SILICON VIA STRUCTURE, METHOD OF FORMATION, AND INTEGRATION IN SEMICONDUCTOR SUBSTRATE

The present application claims the benefit of and priority to a pending provisional patent application entitled "Through Silicon Via with a Pinched Off Region and Related Method," Ser. No. 61/545,003 filed on Oct. 7, 2011. The disclosure in that pending provisional application is hereby incorporated fully by reference into the present application.

BACKGROUND

Semiconductor die density has continuously increased, and continues to increase. Further miniaturization and increased density in semiconductor dies require an increasing number of signal, ground and power electrical interconnects and connections. To make efficient use of limited surface area on semiconductor dies, conventional methods have included forming interconnects within the semiconductor dies using through wafer vias (TWVs). Conventional TWVs may, for example, connect a ground plane on a bottom surface of a semiconductor die with circuitry on a top surface of a semiconductor die. However, such conventional TWVs are typically very wide, for example, 50 μm (micrometers) in diameter. Such large widths result in undesirable characteristics in semiconductor dies and their semiconductor substrates. For example, placement of numerous conventional TWVs within a semiconductor substrate can result in a significant reduction in mechanical stability of the semiconductor substrate. Thus, the number and density of such conventional TWVs placed within a semiconductor substrate must be limited. Such limitations result in large minimum distances between TWVs and semiconductor devices, such as transistors, situated in a semiconductor die.

Moreover, utilizing a small number of conventional TWVs results in an uneven thermal dissipation within the semiconductor substrate, especially during high power operation. The uneven thermal dissipation can result in increased thermal stress in the semiconductor substrate, thus reducing mechanical stability and reliability of the semiconductor die.

Further, although it is desirable to completely fill TWVs with conductive material, conventional fabrication methods result in incomplete filling of the TWVs, especially at their top and bottom portions. The incomplete filling can result in unwanted gaps in the top and bottom portions of the TWVs which can, for example, lead to contamination of the TWVs during subsequent processes.

SUMMARY

The present application is directed to through silicon via structure, method of formation, and integration in semiconductor substrate, substantially as shown in and/or described in connection with at least one of the figures, and as set forth more completely in the claims.

DETAILED DESCRIPTION

Figure 1A:
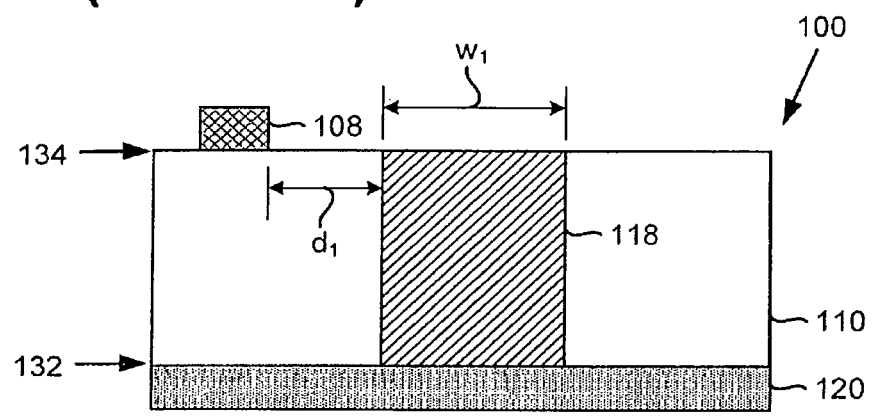
FIG. 1A illustrates an exemplary cross-sectional view of a portion of a semiconductor substrate including a conventional through wafer via.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1B:
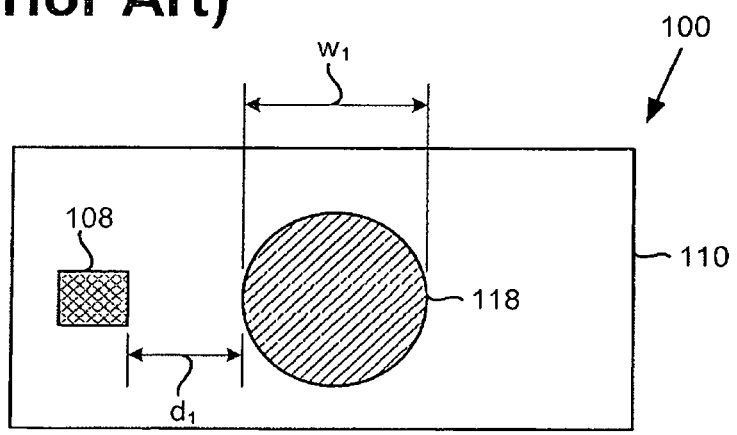
FIG. 1B illustrates an exemplary top view of a portion of a semiconductor substrate including a conventional through wafer via.

FIG. 1A presents an exemplary cross-section of conventional semiconductor structure 100 including exemplary through-wafer via 118 disposed in substrate 110, exemplary semiconductor device 108 disposed on top surface 134 of substrate 110, and ground plane 120 disposed on bottom surface 132 of substrate 110. Similarly, FIG. 1B presents an exemplary top view of conventional semiconductor structure 100. In conventional semiconductor structure 100, through-wafer via 118 may extend from bottom surface 132 of substrate 110 to top surface 134 of substrate 110 and may generally have a uniform width $w_1$. By way of one specific example, width $w_1$ may be approximately 50 μm, where through-wafer via 118 has a circular cross-section. Because through-wafer via 118 extends the entire depth of substrate 110, both through-wafer via 118 and substrate 110 can generally have a depth of, for example, approximately 200 μm. Through-wafer via 118 is also typically contacted at the bottom surface of substrate 110 by ground plane 120. Semiconductor device 108, which may be a transistor for example, is also shown in FIGS. 1A and 1B and may be connected to ground plane 120 by through-wafer via 110. However, due to the very wide cross section of through-wafer via 118, semiconductor device 108 typically requires placement at a distance $d_1$ from through-wafer via 118, which may be, for example, at least 15 μm to 20 μm.

In addition, the very large width of through-wafer via 118 typically limits the number of through-wafer vias that may be formed in a substrate of a particular dimension. For example, in a typical substrate it is common for multiple through-wafer vias to be spaced hundreds of micrometers (μm) apart. Such large spacing between through-wafer vias results in uneven thermal dissipation within the substrate. Differences in the thermal coefficients of substrate 110 and through-wafer via 118 may cause high levels of mechanical stress in substrate 110 when heated, which can lead to cracking of substrate 110. The very large width of exemplary through wafer via 118 can increase such thermally induced mechanical stress in substrate 110.

Figure 2:
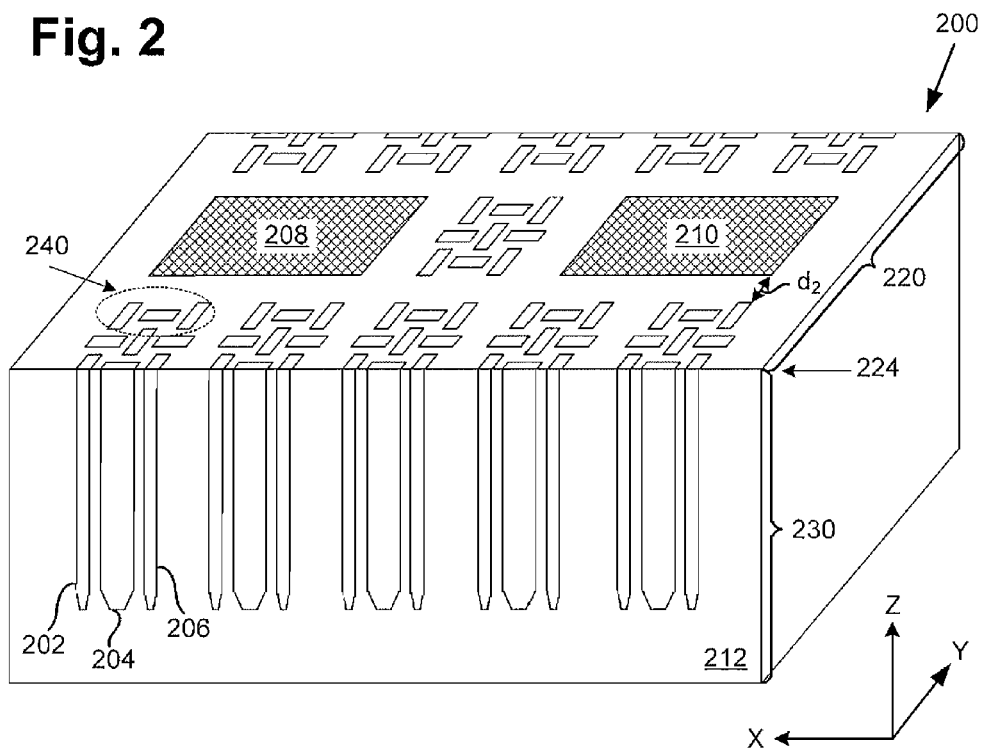
FIG. 2 illustrates an exemplary perspective view of a portion of a semiconductor substrate including through silicon vias in accordance with one implementation of the present application.

FIG. 2 presents an exemplary perspective view of semiconductor structure 200 including top surface 220 of substrate 212 and cross-section 230 of substrate 212, taken at edge 224, for example. Substrate 212 may include narrow through-silicon vias (TSVs) 202, 204 and 206, for example. Substrate 212 may also include various semiconductor devices such as exemplary semiconductor devices 208 and 210. Exemplary semiconductor devices 208 and 210 may be any type of semiconductor device, such as various transistors, for example, NPN bipolar transistors, or any other device without limitation.

Narrow TSVs 202, 204 and 206 may be arranged in arrays, such as array 240 for example, disposed in substrate 212, to suit the needs of a particular application. For example, each of narrow TSVs 202, 204 and 206 may provide a ground connection to exemplary semiconductor devices 208 and 210, for example. In addition, all TSVs in a particular array may be connected to one another by an overlying metal 1 or metal 2 layer (not shown), for example. The novel features of narrow TSVs 202, 204 and 206, which will be discussed in greater detail below, allow exemplary semiconductor devices 208 and 210 to be placed much closer to TSVs 202, 204 and 206 than conventional TWV designs. FIG. 2 shows such a reduced distance $d_2$, which may be 5-10 μm, for example. Thus, as one specific example, exemplary semiconductor devices 208 and 210 may be placed as much as 2 to 3 times closer, in one dimension, to TSVs 202, 204 and 206 as compared to conventional via designs. This allows the present implementation to greatly reduce the amount of wasted substrate area.

In addition, because TSVs 202, 204 and 206 may be placed much closer to each other than in conventional TWV designs, uniform thermal dissipation and heatsinking through TSVs 202, 204 and 206 becomes more practical. Furthermore, the resistance and ground path length of narrow TSVs 202, 204, and 206 are still improved relative to conventional wire bonds, or even relative to through-wafer vias since a greater number of TSVs can be used, which can also be placed closer to ground terminal connections of semiconductor devices, such as semiconductor devices 208 and 210, of semiconductor structure 200.

Figure 3:
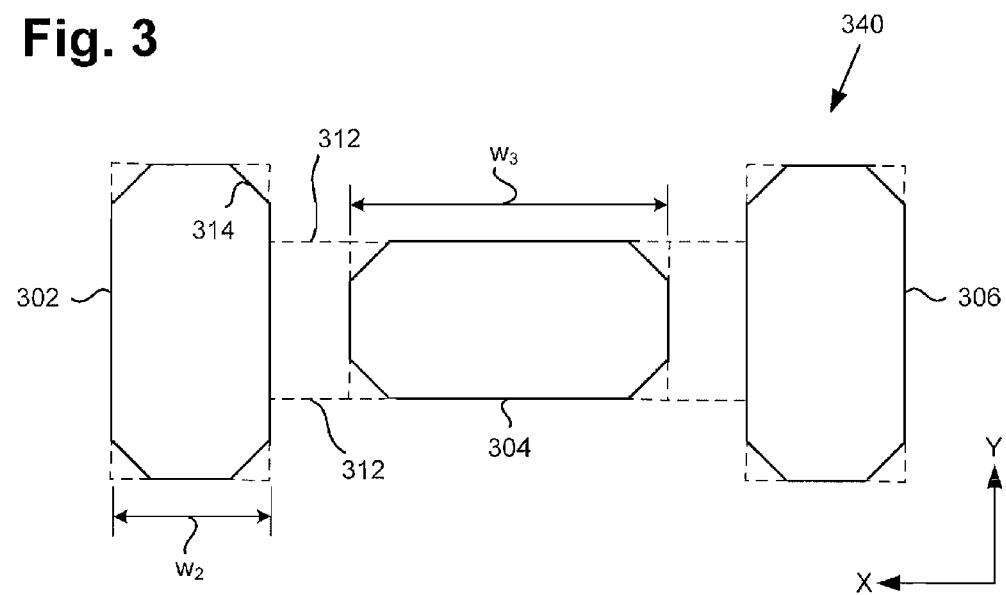
FIG. 3 illustrates an exemplary top view of a semiconductor substrate including through silicon vias having chamfered corners in accordance with one implementation of the present application.

Turning to FIG. 3, FIG. 3 presents an exemplary top view 340 of a portion of TSV array 240 of FIG. 2. TSVs 302, 304 and 306 may each correspond to TSVs 202, 204 and 206 of FIG. 2, respectively. As shown in FIG. 3, each of TSVs 302, 304 and 306 may have a rectangular shape and may, in one particular example, be oriented such that TSVs 302 and 306 have a longer side oriented parallel to a Y-axis (also referred to as being laid out in a "length direction" in the present application) and TSV 304, disposed between TSVs 302 and 306, has a longer side oriented parallel to an X-axis (also referred to as being laid out in a "width direction" in the present application). Thus, according to the implementation presented by FIG. 3, each TSV in an array may be oriented at a 90° angle relative to an adjacent TSV. Such orientation may reduce cracking in the substrate by interrupting naturally forming cleavage planes 312 caused by thermal and mechanical stresses in the substrate.

To further reduce thermal and mechanical stress in the substrate, at least one corner of each of TSVs 302, 304 and 306 may be a chamfered corner 314. Preferably, however, each corner of each TSV may be chamfered. Chamfering each corner of TSVs 302, 304 and 306 may also help to complete the narrow, deep etch required by the present implementation. Each of TSVs 302, 304 and 306 may have the same dimensions. In one specific example, each of TSVs 302, 304 and 306 may have a short side width $w_2$ of 2-5 μm and a long side width $w_3$ of 6-10 μm, for example. Thus, TSVs 302, 304 and 306 allow for greater flexibility in their placement in the substrate due to their significantly smaller size and cleavage plane impeding orientations. Each of TSVs 302, 304 and 306 may be etched into the substrate to a depth of, for example, 100 μm. The finished depth of the TSVs and substrate may then be accurately controlled by polishing the bottom surface of the substrate, as will be discussed in further detail below.

Figure 4:
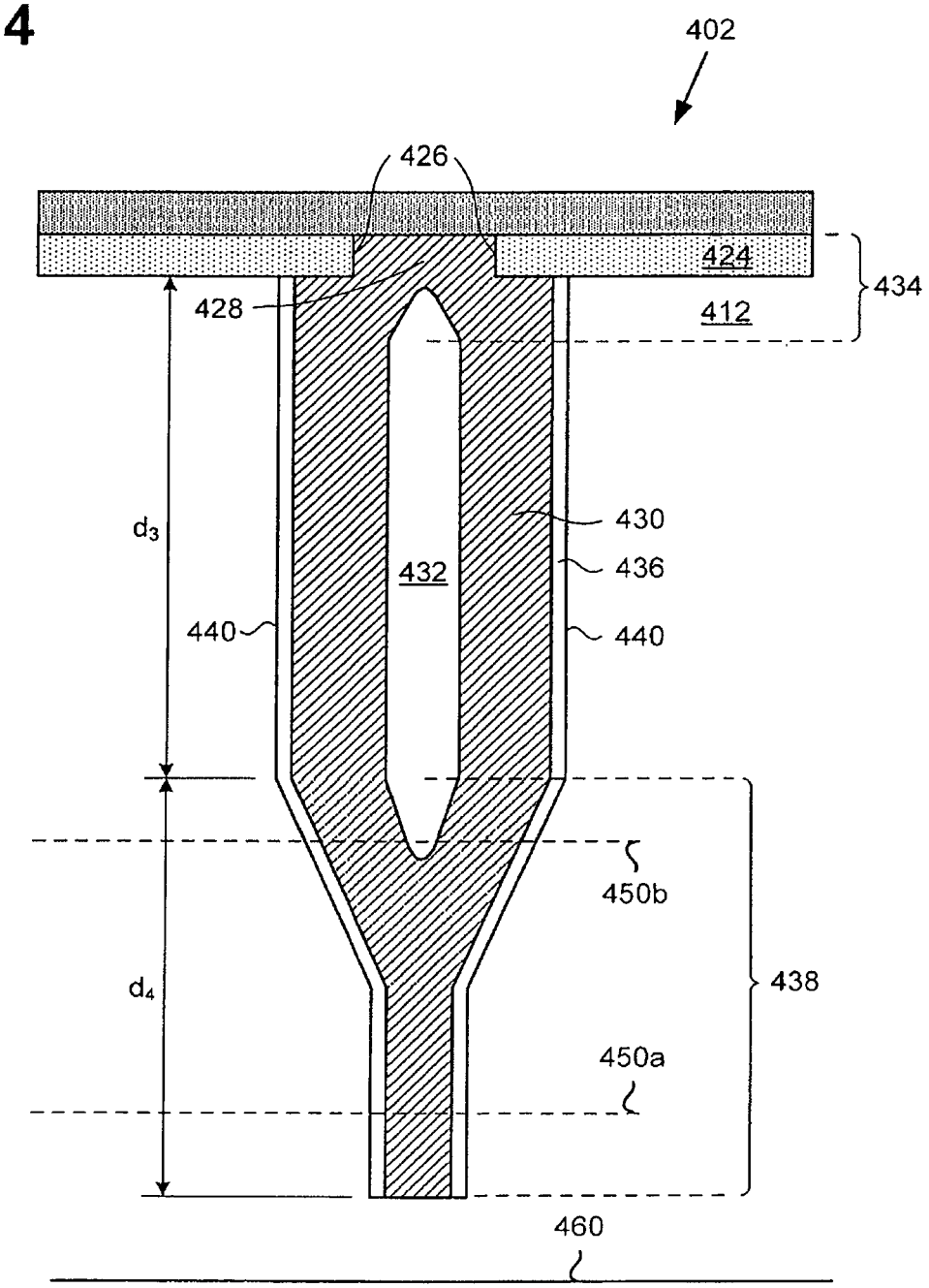
FIG. 4 illustrates an exemplary cross-sectional view of a through silicon via within a semiconductor substrate in accordance with one implementation of the present application.
Figure 5:
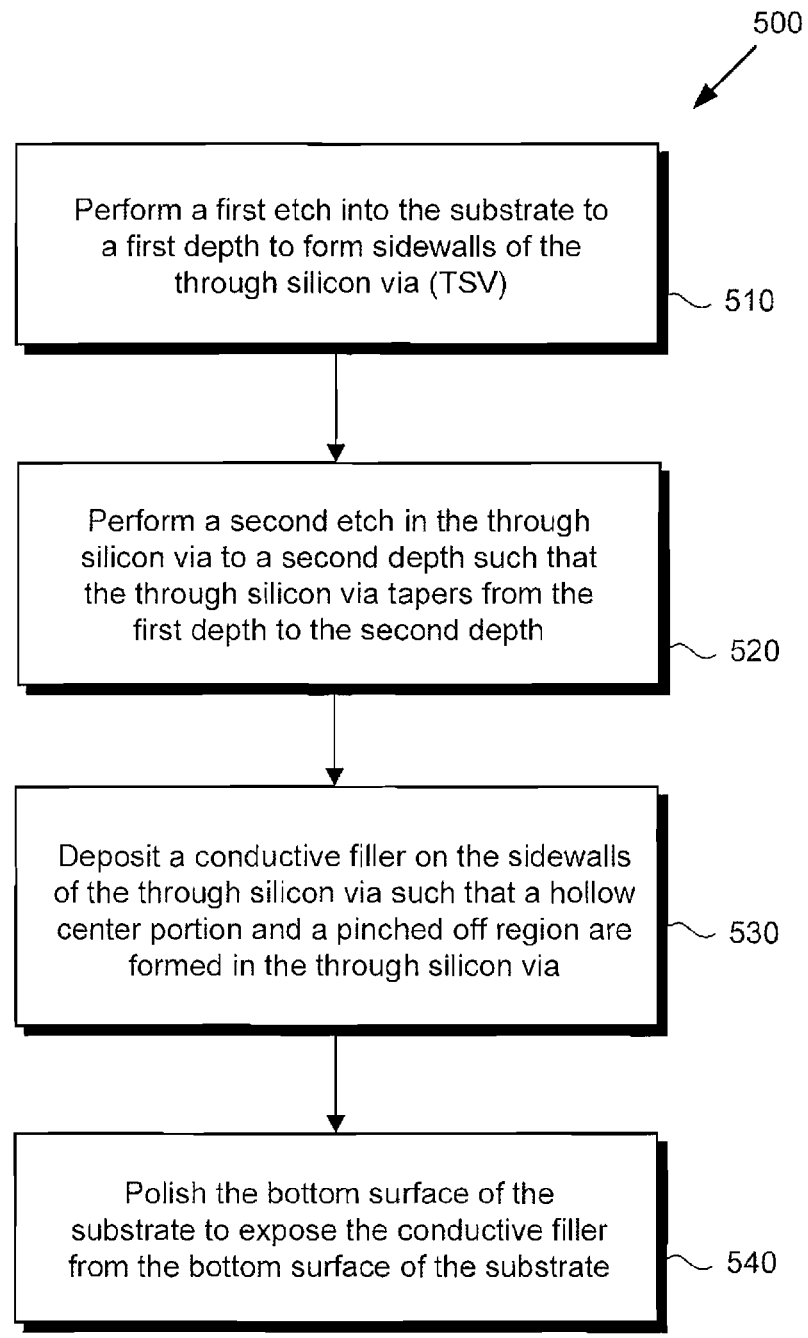
FIG. 5 presents an exemplary flowchart illustrating a method of fabricating a through silicon via in accordance with one implementation of the present application.

The fabrication of one or more TSVs in a semiconductor substrate will be further described by reference to FIGS. 4 and 5. FIG. 4 presents an exemplary magnified view of TSV 402, which may correspond to TSV 202 of FIG. 2, for example. FIG. 5 presents an exemplary flowchart implementing a method of fabricating a through silicon via having a pinched off region such as, for example, TSV 402.

Action 510 of flowchart 500 includes performing a first etch into substrate 412 to first depth $d_3$ to form sidewalls 440 of through silicon via 402. The first etch to first depth $d_3$ may be controlled by, for example, adjusting the time of first etch action 510.

Continuing with action 520 of flow chart 500, action 520 includes performing a second etch in through silicon via 402 to second depth $d_4$ such that through silicon via 402 tapers from first depth $d_3$ to second depth $d_4$. Action 520 may be carried out by varying the etchant power during action 520. As a specific example, etchant power may be varied from 50 watts to 20 watts during etch action 520. Reducing the etchant power allows the formation of a narrowing portion of TSV 402 from first depth $d_3$ to second depth $d_4$. Alternatively, or in addition, adding $O_2$ during action 520 may make the etch more selective, effectively reducing the width of the etch during action 520. Though specific etch techniques are disclosed, action 520 may be achieved by other appropriate etching methods. Thus, action 520 may result in a contouring of the shape of TSV 402 such that a bottom portion (i.e. the portion generally below first depth $d_3$) of TSV 402 tapers. In one specific example, TSV 402 may taper to a width of approximately 1 μm and second depth $d_4$ may be approximately 15 μm.

Once TSV 402 has been etched to second depth $d_4$, optional insulation layer 436 may be deposited on silicon sidewalls 440 of TSV 402. However, preferentially, such an optional insulation layer 436 may not be included to ensure that conductive filler 430 is in contact with silicon sidewalls 440 of TSV 402 and a ground plane on the bottom surface of the substrate, for example.

Action 530 of FIG. 5 includes depositing conductive filler 430 on sidewalls 440 of through silicon via 402 such that hollow center portion 432 and pinched off region 438 are formed in through silicon via 402. The tapered portion of TSV 402 (i.e. the portion generally below depth $d_3$), allows conductive filler 430 to completely fill the bottom portion of TSV 402. In the alternative, conductive filler 430 may by deposited to incompletely fill the bottom portion of TSV 402. In a preferred implementation, conductive filler 430 is a metallic filler, for example, tungsten. Action 530 may be accomplished using any appropriate deposition technique, such as chemical vapor deposition (CVD) or atomic layer deposition (ALD), for example.

Hollow center portion 432 provides many beneficial features. For instance, hollow center portion 432 may serve to reduce intrinsic inductance of TSV 402. Hollow center portion 432 also reduces thermal and mechanical stress in substrate 412 by providing space for conductive filler 430 to expand inward rather than outward in high temperature conditions. Such reduction in thermal and mechanical stress reduces cracking in substrate 412. In addition, hollow center portion 432 in TSV 402 can be formed using present manufacturing tools and without increasing production costs.

In addition to pinched off region 438 at a bottom portion of TSV 402, the present implementation may include forming pinched off region 434 at a top portion of TSV 402. A natural loading effect exists when depositing fillers, which causes an increased deposition at the top of vias. However, to ensure that hollow center portion 432 does not extend to the top of TSV 402, oxide layer 424 may be deposited over the top surface of substrate 412. An opening 428 may be formed in oxide layer 424, over TSV 402, such that sides 426 of opening 428 remain within sidewalls 440 of TSV 402, thus resulting in the width of opening 428 to be smaller than the width of TSV 402. Depositing oxide layer 424 and forming opening 428 ensures pinched off region 434 is formed in the top region of TSV 402, and that hollow center portion 432 does not extend to the top of TSV 402.

Turning to action 540 of flow chart 500, action 540 includes polishing bottom surface 460 of substrate 412 to expose conductive filler 430 from the bottom surface of the substrate. Polish action 540 may be performed until polish line 450a is reached in substrate 412 (i.e. until bottom surface 460 becomes the same as polish line 450a). Polish line 450a may represent a bottom surface of processed substrate 412.

Alternatively, polish action 540 may be performed until polish line 450b is reached in substrate 412 (i.e. until bottom surface 460 becomes the same as polish line 450b), which may represent an alternative bottom surface of processed substrate 412 where an incomplete filling of the bottom portion of TSV 402 is desired.

Carrying out prior action 530 and filling a bottom portion of TSV 402 with conductive filler 430 may ensure that no contamination of TSV 402 occurs during polish action 540, for example. In addition, due to the narrow width of the bottom of TSV 402, a subsequent rough polish will not cause damage to the via, unlike conventional TWV fabrication methods. Consequently, only a rough polish is required at bottom surface 460 to achieve a good contact with a ground plane metal layer which may be subsequently applied to bottom surface 460 of substrate 412. Thus, according to the present implementation, a subsequent fine polish or dry etch at this point in fabrication is avoided.

Thus, various implementations disclosed in the present application provide through silicon vias with a pinched off region which reduce thermal and mechanical stress in semiconductor substrates, as compared to conventional TWVs. Such through silicon vias further reduce the amount of wasted semiconductor substrate area as well as prevent contamination of the through silicon vias during semiconductor substrate processing.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor substrate having a plurality of devices, said semiconductor substrate comprising:

a plurality of through silicon vias disposed in said substrate extending from a top surface of said substrate to a bottom surface of said substrate;

a conductive filler disposed within each of said plurality of through silicon vias, each of said plurality of through silicon vias having a hollow center to reduce thermal stress in said semiconductor substrate, said hollow center being entirely surrounded by said conductive filler to provide space for said conductive filler to expand inward;

wherein each of said plurality of through silicon vias has a pinched off region at a bottom portion to prevent contamination during processing of said semiconductor substrate, and wherein said hollow center is tapered in said pinched off region.

2. The semiconductor substrate of claim 1, wherein said pinched off region is formed by tapering a bottom portion of each of said plurality of through silicon vias.

3. The semiconductor substrate of claim 1, wherein said preventing contamination during said processing is achieved by preventing contamination during polishing said bottom surface of said substrate.

4. The semiconductor substrate of claim 1, wherein said conductive filler comprises a metallic filler.

5. The semiconductor substrate of claim 1, wherein said conductive filler comprises tungsten.

6. The semiconductor substrate of claim 1, wherein each of said plurality of through silicon vias is tapered at a bottom portion such that said conductive filler fills said bottom portion, pinching off said hollow center.

7. The semiconductor substrate of claim 1, wherein a first group of said plurality of through silicon vias are laid out in a width direction and a second group of said plurality of through silicon vias are laid out in a length direction.

8. The semiconductor substrate of claim 1, wherein each of said plurality of through silicon vias has at least one chamfered corner.

9. The semiconductor substrate of claim 1, further comprising a pinched off region at a top of each of said plurality of through silicon vias.

10. The semiconductor substrate of claim 1, wherein each of said plurality of through silicon vias is tapered at a bottom portion such that said conductive filler incompletely fills said bottom portion, narrowing said hollow center.

11. A semiconductor substrate having a plurality of devices, said semiconductor substrate comprising:

a plurality of through silicon vias disposed in said substrate extending from a top surface of said substrate to a bottom surface of said substrate;

a conductive filler disposed within each of said plurality of through silicon vias, each of said plurality of through silicon vias having a hollow center being entirely surrounded by said conductive filler to provide space for said conductive filler to expand inward for reducing thermal stress in said semiconductor substrate;

wherein each of said plurality of through silicon vias has a pinched off region at a top portion and another pinched off region at a bottom portion to prevent contamination during processing of said semiconductor substrate, and wherein said hollow center is tapered in said another pinched off region.

12. The semiconductor substrate of claim 11, further comprising a dielectric layer disposed on said top surface of said substrate, wherein said dielectric layer has a plurality of openings, each situated over one of said plurality of through silicon vias, and having a width smaller than a width of said through silicon vias.

13. The semiconductor substrate of claim 11, wherein said conductive filler comprises a metallic filler.

14. The semiconductor substrate of claim 11, wherein said conductive filler comprises tungsten.

15. The semiconductor substrate of claim 11, wherein a first group of said plurality of through silicon vias are laid out in a width direction and a second group of said plurality of through silicon vias are laid out in a length direction.

16. The semiconductor substrate of claim 11, wherein each of said plurality of through silicon vias has at least one chamfered corner.

17. The semiconductor substrate of claim 11, wherein said another pinched off region is tapered at said bottom of each of said plurality of through silicon vias.

18. The semiconductor substrate of claim 11, wherein each of said plurality of through silicon vias is tapered at a bottom portion such that said conductive filler incompletely fills said bottom portion, narrowing said hollow center.

* * * * *